US006624705B1

(12) United States Patent
Huard et al.

(10) Patent No.: US 6,624,705 B1
(45) Date of Patent: Sep. 23, 2003

(54) CONTROL CIRCUIT FOR PHASE-LOCKED LOOP (PLL) WITH REDUCED CYCLE SLIP DURING ACQUISITION OF PHASE LOCK

(75) Inventors: Jeffrey Huard, Puyallup, WA (US); Wayne Porter, Colorado Springs, CO (US); David Broughton, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 16 days.

(21) Appl. No.: 10/116,657

(22) Filed: Apr. 4, 2002

(51) Int. Cl.[7] .............................. H03L 7/06; H03L 7/10; H03L 7/18; H03L 7/16
(52) U.S. Cl. ............................ 331/16; 331/17; 331/25; 331/18; 327/156; 327/157
(58) Field of Search ........................... 331/1 A, 16, 17, 331/18, 25, DIG. 2; 327/156–159; 332/127; 360/51; 375/376; 455/260

(56) References Cited

U.S. PATENT DOCUMENTS 5,260,979 A * 11/1993 Parker et al. ............... 375/366
6,044,123 A * 3/2000 Takla ......................... 375/376
6,084,479 A * 7/2000 Duffy et al. .................. 331/17

OTHER PUBLICATIONS

National Semiconductor, A Fast Locking Scheme for PLL Frequency Synthesizers, Journal, Jul. 1995, AN–1000, total pages attached (7), USA.

* cited by examiner

Primary Examiner—David C. Mis
(74) Attorney, Agent, or Firm—Vedder, Price, Kaufman & Kammholz, P.C.

(57) ABSTRACT

A circuit for controlling a phase-locked loop (PLL) with reduced cycle slip during acquisition of phase lock includes frequency dividers with selectable divisors for the reference and feedback signals, and a phase detector having a charge pump output circuit with selectable output current ranges. During acquisition of phase lock by the PLL, the divisors for the reference and feedback signal frequency dividers are increased by the same factor, and the charge pump current range is increased by the same ratio. As a result, the reference rate is decreased as the charge pump current range is increased simultaneously by the same ratio. Meanwhile, the linear loop bandwidth and phase margin remain substantially constant.

20 Claims, 2 Drawing Sheets

CONTROL CIRCUIT FOR PHASE-LOCKED LOOP (PLL) WITH REDUCED CYCLE SLIP DURING ACQUISITION OF PHASE LOCK

BACKGROUND OF THE INVENTION

1. Field of the Invention

The present invention relates to control circuits for phase-locked loops (PLLs), and in particular, to control circuits for PLLs having accelerated phase lock times and high sample rates, such as fractional PLLs.

2. Description of the Related Art

Frequency synthesizers are used extensively in wireless applications, such as time division multiplexed and frequency hopping systems, where fast acquisition of phase, or frequency, lock is critical. Also critical is the suppression of spurious signals (e.g., such as those related to the reference signal frequency) and phase noise, particularly for modern digital signal transmission systems.

Channel spacing requirements for such communication systems typically determine the limits for the frequency resolution and loop filter bandwidth associated with such synthesizers. For example, closely spaced channels require the synthesizer frequency resolution to be fine, which, in turn, requires fewer frequency corrections by the loop. While a wider loop filter bandwidth would allow acquisition of phase lock within a shorter time interval, less attenuation would be available for the reference signal frequency sidebands and a higher integrated phase noise would exist during the phase locked condition.

Referring to FIG. 1, a conventional frequency synthesizer 10 using a PLL includes a reference signal source 12, a reference divider circuit 14, a phase detector circuit 16, a charge pump circuit 18, a loop filter circuit 20, a controllable oscillator (e.g., voltage controlled oscillator) 22 and a feedback divider circuit 24, all interconnected substantially as shown. The reference signal source 12, typically a high stability crystal oscillator, provides the reference signal 13 that is frequency-divided by the reference divider circuit 14 to produce a frequency-divided reference signal 15 having a frequency Fr and phase Pr. This reference divider circuit 14 (e.g., a counter) determines the tuning resolution of the overall system 10.

This frequency-divided reference signal 15 is compared with a feedback signal 25 (discussed further below) by the phase detector circuit 16. In accordance with well known conventional techniques, the phases Pr, Pf of these two input signals 15, 25 are compared to one another to produce two control signals 17r, 17f for controlling the charge pump circuit 18. As is well known, depending upon whether the feedback signal 25 is higher or lower in frequency than the frequency-divided reference signal 15, one or the other of the control signals 17r, 17f is active, or asserted, thereby causing the charge pump circuit 18 to source electrical current into or sink electrical current out of the output node 19. The phase detector 16 and charge pump 18 together have an associated gain factor $K\phi$.

This output charge signal 1.9 provides the input charge to the loop filter circuit 20 which converts such charge into a control voltage 21 for the oscillator circuit 22. In accordance with this control voltage 21, the oscillator circuit 22 generates a radio frequency (RF) output signal 23 having an associated signal frequency Fo and phase Po. This signal 23 is frequency-divided by the feedback divider-circuit 24 (e.g., a counter) to produce the frequency-divided feedback signal 25. The oscillator circuit has a gain factor Kvco/s associated with it.

By comparing the phases Pr, Pf of its input signals, the phase detector 16, in conjunction with the charge pump 18 and loop filter 20, as discussed above, causes the control voltage 21 to the oscillator 22 to be adjusted until the frequency-divided feedback signal 25 has a frequency Ff equal to the frequency Fr of (and phase-aligned with) the frequency-divided reference signal 15. When this condition exists, the PLL 10 is said to be "phase-locked" and the frequency Fo of the oscillator output 23 will be N-times that of the frequency-divided reference signal 15.

Referring to FIG. 2, a well known conventional design for a charge pump circuit 18a includes P-type and N-type metal oxide semiconductor field effect transistors (MOSFETs) connected in a stacked configuration with a current limiting resistor Rdd (as appropriate) between the power supply VDD and circuit ground GND. The charge pump control signals 17r, 17f, turn these transistor N1, P1 on and off for selectively sinking current from or sourcing current to the output terminal 19.

Referring to FIG. 3, a well known conventional design for a passive loop filter circuit 20a includes a shunt capacitor C1 connected in parallel with another shunt circuit having another capacitor C2 and resistor R2 connected in series between the signal terminal 19 and circuit ground GND.

Referring to FIG. 4, the linear control system model for the phase feedback for the synthesizer system 10 of FIG. 1 can be represented as shown. An input summing circuit 16a differentially sums the phases of the frequency-divided reference Pr and feedback Pf signals to produce a phase error Pe which, ideally, will be-driven to zero upon acquisition of phase lock. The open loop gain for this model is the product of the phase comparator gain $K\phi$, the loop filter gain $Z(s)$ and the oscillator gain Kvco/s, divided by the gain of the feedback counter modulus N in accordance with the following equation:

$$Pf/Pe = K\phi \cdot Z(s) \cdot Kvco/(N \cdot s)$$

So as to minimize phase lock time, the cutoff frequency of the loop filter 20 is selected to be just low enough to suppress the spurious signals related to the frequency-divided reference signal frequency Fr to an acceptable level. One conventional technique for reducing the phase lock time is to dynamically change the cutoff frequency for the loop filter 20 to a higher frequency, thereby reducing the loop response time. Of course, this results in increased spurious signal levels. In order to maintain the same phase margin at this increased loop filter cutoff frequency, other terms in the gain equation above will need to provide some compensation.

One conventional technique has been to reduce the value of the resistor R2 in the loop filter 20 (FIG. 3) during the interval of time used for acquisition of phase lock while also increasing the gain factor $K\phi$ (by the square of the factor by which the cutoff frequency of the loop filter 20 is increased) of the phase detector and charge pump combination since it can be readily switched in an integrated circuit environment. For example, if the cutoff frequency of the loop filter 20 is doubled, i.e., a factor of 2, the gain factor $K\phi$, i.e., the available charge pump output current, is increased by a factor of 4 (with the value of the damping resistor reduced by half to maintain a constant phase margin).

While this technique does offer some improvement in the phase lock acquisition interval, such improvement is relatively small. In other words, the improvement in reducing cycle slip using this technique is proportional to the square root of the increase in the gain factor $K\phi$ (available charge pump output current). It would be desirable to be able to improve cycle slip by a greater degree without needing to rely upon a high charge pump current ratio which can cause spurious signal problems as well as consume significant integrated circuit area.

SUMMARY OF THE INVENTION

A control circuit for a PLL with reduced cycle slip during acquisition of phase lock in accordance with the present invention reduces the loop sampling rate while simultaneously increasing the available charge pump current, thereby maintaining a substantially constant loop bandwidth and phase margin during acquisition of phase lock. This significantly reduces cycle slipping, thereby reducing the amount of time needed for acquiring phase lock. Further, this technique is compatible and can be used in conjunction with conventional "fast lock" techniques, such as those in which the loop bandwidth in increased. In accordance with the present invention, the improvement in reducing cycle slipping is directly proportional to the increase in current available from the charge pump.

In accordance with one embodiment of the presently claimed invention, a control circuit for a phase-locked loop (PLL) with reduced cycle slip during acquisition of phase lock includes reference division circuitry, feedback division circuitry, phase comparison circuitry and control circuitry. The reference division circuitry, responsive to a reference division control signal, receives and frequency-divides a reference signal with an associated reference signal frequency to provide a frequency-divided reference signal with associated first and second frequency-divided reference signal phases and frequencies corresponding to first and second values of the reference division control signal. The feedback division circuitry, responsive to a feedback division control signal, receives and frequency-divides a feedback signal with an associated feedback signal frequency to provide a frequency-divided feedback signal with associated first and second frequency-divided feedback signal phases and frequencies corresponding to first and second values of the feedback division control signal. The phase comparison circuitry, including output current circuitry and coupled to the reference and feedback division circuitry, compares the frequency-divided reference and feedback signal phases and in response to the phase comparison and a current control signal provides an output state signal and an output current signal with first and second output current signal value ranges corresponding to first and second values of the current control signal. The control circuitry, coupled to the phase comparison circuitry and the reference and feedback division circuitry, responsive to a phase lock control signal and the output state signal, provides the current control signal and the reference and feedback division control signals. A first ratio of the first and second frequency-divided reference signal frequencies, a second ratio of the first and second frequency-divided feedback signal frequencies and a third ratio of the first and second output current signal value ranges are mutually corresponding.

In accordance with another embodiment of the presently claimed invention, a control circuit for a phase-locked loop (PLL) with reduced cycle slip during acquisition of phase lock includes reference divider means, feedback divider means, phase comparator means and controller means. The reference divider means is for responding to a reference division control signal by receiving and frequency-dividing a reference signal with an associated reference signal frequency and providing a frequency-divided reference signal with associated first and second frequency-divided reference signal phases and frequencies corresponding to first and second values of the reference division control signal. The feedback divider means is for responding to a feedback division control signal by receiving and frequency-dividing a feedback signal with an associated feedback signal frequency and providing a frequency-divided feedback signal with associated first and second frequency-divided feedback signal phases and frequencies corresponding to first and second values of the feedback division control signal. The phase comparator means, including output current means, is for comparing the frequency-divided reference and feedback signal phases and responding to the phase comparison and a current control signal by providing an output state signal and an output current signal with first and second output current signal value ranges corresponding to first and second values of the current control signal. The controller means is for responding to a phase lock control signal and the output state signal by providing the current control signal and the reference and feedback division control signals. A first ratio of the first and second frequency-divided reference signal frequencies, a second ratio of the first and second frequency-divided feedback signal frequencies and a third ratio of the first and second output current signal value ranges are mutually corresponding.

In accordance with still another embodiment of the presently claimed invention, a method for controlling a phase-locked loop (PLL) with reduced cycle slip during acquisition of phase lock includes:

receiving and frequency-dividing a reference signal with an associated reference signal frequency and generating a frequency-divided reference signal with associated first and second frequency-divided reference signal phases and frequencies corresponding to first and second values of the reference division control signal;

receiving and frequency-dividing a-feedback signal with an associated feedback signal frequency and generating a frequency-divided feedback signal with associated first and second frequency-divided feedback signal phases and frequencies corresponding to first and second values of the feedback division control signal;

comparing the frequency-divided reference and feedback signal phases and responding to the phase comparison by generating an output current signal with first and second output current signal value ranges corresponding to first and second values of the current control signal; and controlling the generating of the frequency-divided reference signal, the frequency-divided feedback signal and the output current signal such that a first ratio of the first and second frequency-divided reference signal frequencies, a second ratio of the first and second frequency-divided feedback signal frequencies and a third ratio of the first and second output current signal value ranges are mutually corresponding.

DETAILED DESCRIPTION OF THE INVENTION

Figure 1:
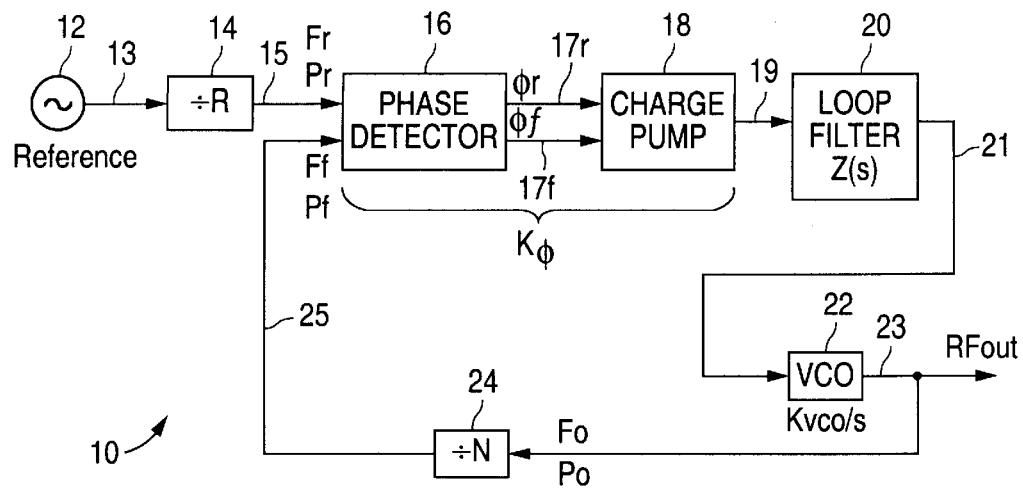
FIG. 1 is a functional block diagram of a conventional PLL circuit.
Figure 2:
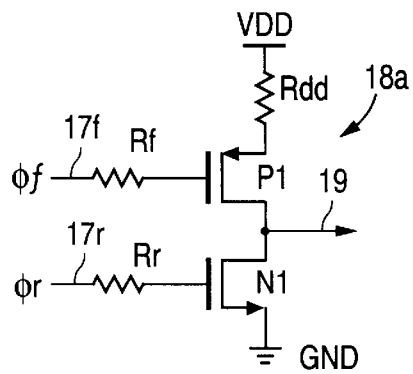
FIG. 2 is a schematic diagram of a conventional charge pump circuit.
Figure 3:
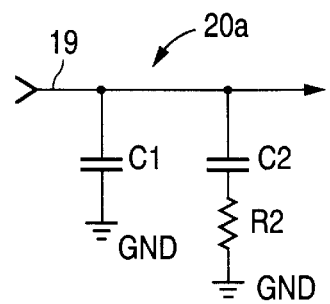
FIG. 3 is a schematic diagram of a conventional PLL loop filter circuit in the form of a low pass filter.
Figure 4:
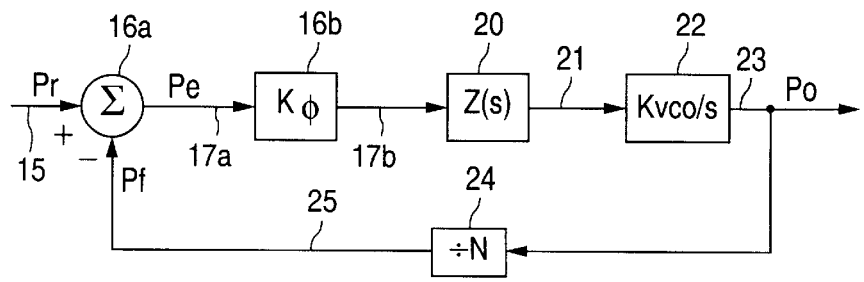
FIG. 4 is a functional block diagram of the linear control system model for the PLL circuit of FIG. 1.
Figure 5:
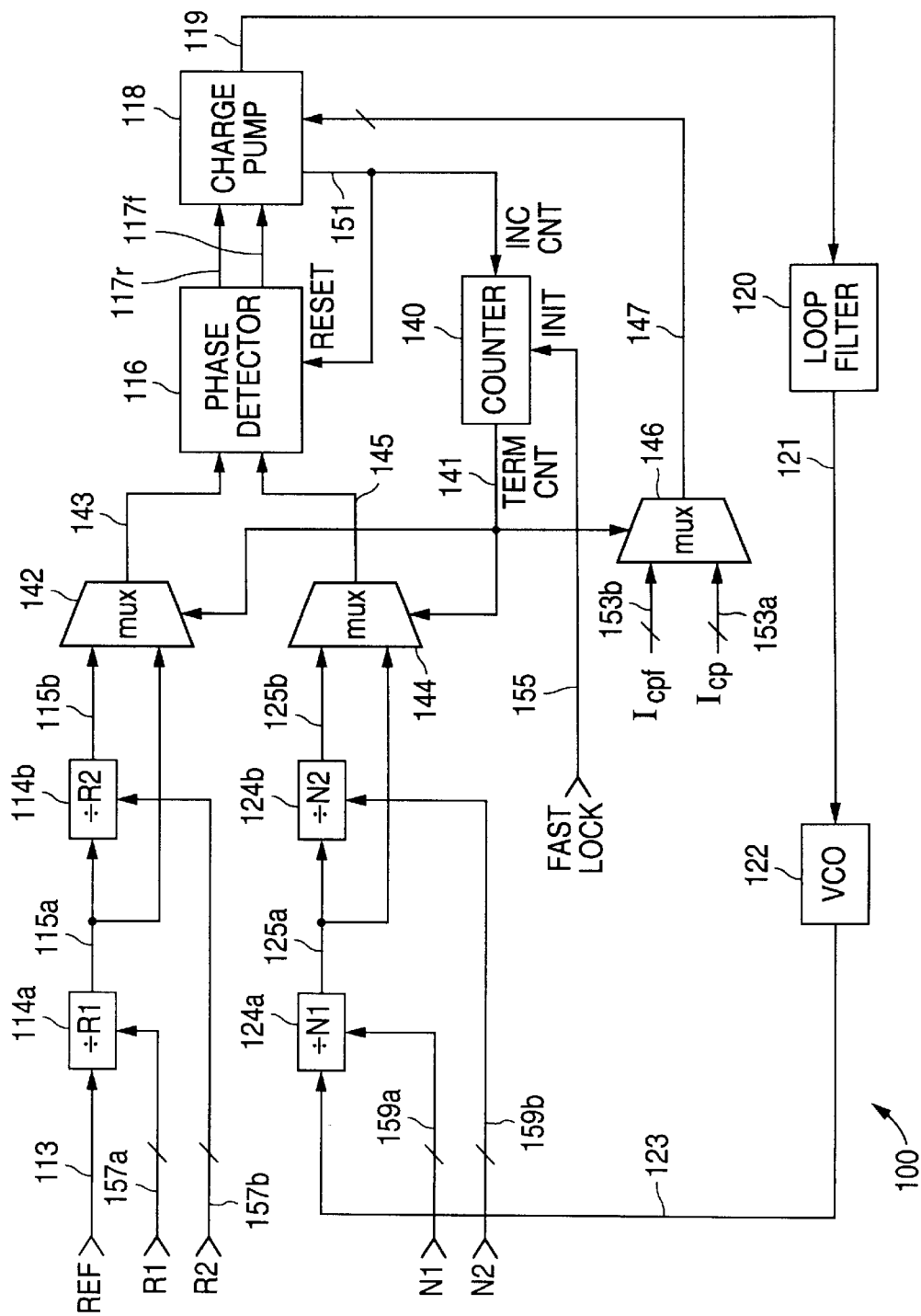
FIG. 5 is a functional block diagram of a PLL circuit with a control circuit for reducing cycle slip during acquisition of phase lock in accordance with one embodiment of the presently claimed invention.

Referring to FIG. 5, a control circuit for a PLL 100 with reduced cycle slip during acquisition of phase lock in accordance with one embodiment of the presently claimed invention has a circuit topology similar to that of a conventional PLL system, but with some additional functional elements. As will be described, these additional elements, during the interval associated with acquisition of phase lock, temporarily reduce the normally higher phase detector sampling rates, thereby significantly reducing the risk of cycle slipping, i.e., where a phase error of greater than $2\pi$ (360°) occurs at the phase detector. Additionally, for conventional latched base phase detectors, temporarily decreasing the phase detector sampling rate, and thereby increasing the associated reference signal period, the probability of the reset pulse causing the charge pump to pump charge in the wrong direction is decreased.

The input reference signal 113 is frequency-divided by a programmable counter 114a. The resulting frequency-divided signal 115a is frequency-divided again by another programmable counter 114b. These frequency-divided reference signals 115a, 115b are presented to a signal switching circuit, such as a multiplexor 142, with the resulting selected frequency-divided signal 143 being presented to the phase detector 116 as the frequency divided reference signal.

Similarly, the feedback signal 123 from the oscillator 122 is frequency-divided by a programmable counter 124a. This first frequency-divided feedback signal 125a is further frequency-divided by another programmable counter 124b. These frequency-divided feedback signals 125a, 125b are presented to a signal switching circuit, such as a multiplexor 144, with the resulting frequency-divided feedback signal 145 being presented to the phase detector 116.

Frequency division programming data 157a, 157b, 159a, 159b are provided to the programmable counters 114a, 144b, 124a, 124b as necessary to coordinate the frequency division ratios R1, R2, N1, N2 when changing the desired output frequency for the oscillator 122 (e.g., when "changing channels").

The phase detector 116, in a conventional manner, compares and detects the respective signal phases of the frequency-divided reference 143 and feedback 145 signals, and provides the appropriate charge pump control signals 117f, 117r (e.g., "pump up" and "pump down" control signals). Further in accordance with conventional techniques, the charge pump 118 appropriately sources or sinks an output current 119 which is converted by the loop filter 120 to the control voltage 121 for the oscillator 122.

The charge pump 118, also in accordance with well-known conventional techniques, provides an output control signal 151. This signal 151 is active, or asserted, when both output current pumps are active. In other words, the charge pump 118 contains sensing, or detection, circuits (e.g., current or voltage detection circuits) that monitor the states of the output current source and sink circuits. When both output current source (pump up) and sink (pump down) circuits are active, i.e., current is being simultaneously sourced and sunk to and from the output 119, this output control signal 151 is asserted. Such simultaneous activity of both the current source and sink output circuits occurs at the end of a phase detector event. This avoids what is referred to as a "dead band" condition. Hence, by resetting the phase detector 116 and causing both the current source and sink circuits to be turned off, such "dead band" operation is avoided, thereby allowing phase lock to be acquired.

This output control signal 151 is also used to increment a counter 140 which controls the actions of this circuit 100 during "fast" phase lock. During static circuit operation, i.e., where the PLL circuit 100 has acquired phase lock and is operating at a static, or fixed, frequency, the terminal count output 141 of the counter 140 is asserted, or active. Accordingly, the higher frequency-divided reference 115a and feedback 125a signals are selected and provided as the phase-detected-signals 143, 145 to the phase detector 116. Additionally, another signal selector, such as a multiplexor 146, is selecting a data signal 153a representing normal charge pump output current, and presenting this data 147 to the charge pump circuit 118.

When a new frequency is to be selected, and fast acquisition of phase lock is desired, a fast lock control signal 155 is used to initialize, or activate, the counter 140, thereby causing the terminal count output 141 to become unasserted, or inactive. In turn, this causes the lower frequency reference 115b and feedback 125b signals to be selected and presented as the phase-detected signals 143, 145 to the phase detector 116. (These lower frequency reference 115b and feedback 125b signals are lower in frequency than their higher frequency counterpart reference 115a and feedback 125a signals by the frequency division factors R2 and N2 respectively, which are equal.) Simultaneously, charge pump control data 153b representing the increased current capability of the charge pump 118 are selected and provided as the charge pump control data 147 to the charge pump 118. By simultaneously increasing the charge pump current and decreasing the phase detector frequency, constant loop bandwidth and phase margin are maintained.

Each time the charge pump control signal 151 is asserted, the counter 140 is incremented. This happens until the counter 140 reaches a predetermined count value, upon which the terminal count output signal 141 is returned to its asserted state, thereby causing the higher frequency-divided reference 115a and feedback 125a signals to be presented as the phase-detected signals 143, 145 to the phase detector 116, and the original control data 153 to be presented as the charge pump control data 147 to the charge pump 118:

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a control circuit for a phase-locked loop (PLL) with reduced cycle slip during acquisition of phase lock, comprising:
    reference division circuitry that, responsive to a reference division control signal, receives and frequency-divides a reference signal with an associated reference signal frequency to provide a frequency-divided reference signal with associated first and second frequency-divided reference signal phases and frequencies corresponding to first and second values of said reference division control signal;

feedback division circuitry that, responsive to a feedback division control signal, receives and frequency-divides a feedback signal with an associated feedback signal frequency to provide a frequency-divided feedback signal with associated first and second frequency-divided feedback signal phases and frequencies corresponding to first and second values of said feedback division control signal;

phase comparison circuitry, including output current circuitry and coupled to said reference and feedback division circuitry, that compares said frequency-divided reference and feedback signal phases and in response to said phase comparison and a current control signal provides an output state signal and an output current signal with first and second output current signal value ranges corresponding to first and second values of said current control signal; and control circuitry, coupled to said phase comparison circuitry and said reference and feedback division circuitry, that, responsive to a phase lock control signal and said output state signal, provides said current control signal and said reference and feedback division control signals;

wherein a first ratio of said first and second frequency-divided reference signal frequencies, a second ratio of said first and second frequency-divided feedback signal frequencies and a third ratio of said first and second output current signal value ranges are mutually corresponding.

2. The apparatus of claim 1, wherein said reference division circuitry comprises:

frequency division circuitry with an input terminal, an output terminal and an intermediate terminal that frequency-divides said reference signal to provide a reduced frequency reference signal and a further reduced frequency reference signal, wherein
said input terminal conveys said reference signal,
said intermediate terminal conveys said reduced frequency reference signal, and
said output terminal conveys said further reduced frequency reference signal; and signal selection circuitry, coupled to said frequency division circuitry intermediate and output terminals, that, responsive to said reference division control signal, selects between and provides one of said reduced and further reduced frequency reference signals as said frequency-divided reference signal.

3. The apparatus of claim 1, wherein said feedback division circuitry comprises:

frequency division circuitry with an input terminal, an output terminal and an intermediate terminal that frequency-divides said feedback signal to provide a reduced frequency feedback signal and a further reduced frequency feedback signal, wherein said input terminal conveys said feedback signal,
said intermediate terminal conveys said reduced frequency feedback signal, and
said output terminal conveys said further reduced frequency feedback signal; and signal selection circuitry, coupled to said frequency division circuitry intermediate and output terminals, that, responsive to said feedback division control signal, selects between and provides one of said reduced and further reduced frequency feedback signals as said frequency-divided feedback signal.

4. The apparatus of claim 1, wherein said phase comparison circuitry comprises:

phase detector circuitry that detects said frequency-divided reference and feedback signal phases and in response to said phase detection provides first and second pump control signals; and charge pump circuitry, coupled to said phase detector circuitry, that, responsive to said first and second pump control signals, provides said output current signal and said output state signal.

5. The apparatus of claim 4, wherein said charge pump circuitry comprises:

current source circuitry that sources a first portion of said output current signal in response to said first pump control signal;

current sink circuitry that sinks a second portion of said output current signal in response to said second pump control signal; and detection circuitry, coupled to said current source and sink circuitry, that asserts said output state signal following a detection of simultaneous sourcing and sinking of said first and second portions of said output current signal.

6. The apparatus of claim 1, wherein said control circuitry comprises:

counter circuitry, coupled to said phase comparison circuitry and said reference and feedback division circuitry, that, responsive to said phase lock control signal and said output state signal, provides said first and second division control signals and a signal selection control signal; and signal selection circuitry, coupled to said phase comparison circuitry and said counter circuitry, that, responsive to said signal selection control signal, selects between and provides one of a plurality of selectable signals as said current control signal.

7. The apparatus of claim 6, wherein said counter circuitry comprises a programmable counter circuit that, responsive to said phase lock control signal, counts a sequence of assertions of said output state signal.

8. The apparatus of claim 1, further comprising controllable oscillator circuitry, coupled between said phase comparison circuitry and said feedback division circuitry, that, responsive to said output current signal, provides said feedback signal.

9. The apparatus of claim 1, wherein said first and second ratios are equal.

10. The apparatus of claim 9, wherein said first, second and third ratios are equal.

11. An apparatus including a control circuit for a phase-locked loop (PLL) with reduced cycle slip during acquisition of phase lock, comprising:

reference divider means for responding to a reference division control signal by receiving and frequency-dividing a reference signal with an associated reference signal frequency and providing a frequency-divided reference signal with associated first and second frequency-divided reference signal phases and frequencies corresponding to first and second values of said reference division control signal;

feedback divider means for responding to a feedback division control signal by receiving and frequency-dividing a feedback signal with an associated feedback signal frequency and providing a frequency-divided feedback signal with associated first and second frequency-divided feedback signal phases and frequencies corresponding to first and second values of said feedback division control signal;

phase comparator means, including output current means, for comparing said frequency-divided reference and feedback signal phases and responding to said phase comparison and a current control signal by providing an output state signal and an output current signal with first and second output current signal value ranges corresponding to first and second values of said current control signal; and controller means for responding to a phase lock control signal and said output state signal by providing said current control signal and said reference and feedback division control signals;

wherein a first ratio of said first and second frequency-divided reference signal frequencies, a second ratio of said first and second frequency-divided feedback signal frequencies and a third ratio of said first and second output current signal value ranges are mutually corresponding.

12. The apparatus of claim 11, wherein said reference divider means comprises:

frequency divider means for frequency-dividing said reference signal and generating a reduced frequency reference signal and a further reduced frequency reference signal; and signal selector means for responding to said reference division control signal by selecting between and providing one of said reduced and further reduced frequency reference signals as said frequency-divided reference signal.

13. The apparatus of claim 11, wherein said feedback divider means comprises:

frequency divider means for frequency-dividing said feedback signal and generating a reduced frequency feedback signal and a further reduced frequency feedback signal; and signal selector means for responding to said feedback division control signal by selecting between and providing one of said reduced and further reduced frequency feedback signals as said frequency-divided feedback signal.

14. The apparatus of claim 11, wherein said phase comparator means comprises:

phase detector means for detecting said frequency-divided reference and feedback signal phases and in response to said phase detection generating first and second pump control signals; and charge pump means for responding to said first and second pump control signals by generating said output current signal and said output state signal.

15. The apparatus of claim 11, wherein said controller means comprises:

counter means for responding to said phase lock control signal and said output state signal by generating said first and second division control signals and a signal selection control signal; and signal selector means for responding to said signal selection control signal by selecting between and providing one of a plurality of selectable signals as said current control signal.

16. The apparatus of claim 11, wherein said first and second ratios are equal.

17. The apparatus of claim 11, wherein said first, second and third ratios are equal.

18. A method for controlling a phase-locked loop (PLL) with reduced cycle slip during acquisition of phase lock, comprising:

receiving and frequency-dividing a reference signal with an associated reference signal frequency and generating a frequency-divided reference signal with associated first and second frequency-divided reference signal phases and frequencies corresponding to first and second values of said reference division control signal;

receiving and frequency-dividing a feedback signal with an associated feedback signal frequency and generating a frequency-divided feedback signal with associated first and second frequency-divided feedback signal phases and frequencies corresponding to first and second values of said feedback division control signal;

comparing said frequency-divided reference and feedback signal phases and responding to said phase comparison by generating an output current signal with first and second output current signal value ranges corresponding to first and second values of said current control signal; and controlling said generating of said frequency-divided reference signal, said frequency-divided feedback signal and said output current signal such that a first ratio of said first and second frequency-divided reference signal frequencies, a second ratio of said first and second frequency-divided feedback signal frequencies and a third ratio of said first and second output current signal value ranges are mutually corresponding.

19. The method of claim 18, wherein said controlling of said generating of said frequency-divided reference signal, said frequency-divided feedback signal and said output current signal comprises controlling said generating of said frequency-divided reference signal, said frequency-divided feedback signal and said output current signal such that said first and second ratios are equal.

20. The method of claim 19, wherein said controlling of said generating of said frequency-divided reference signal, said frequency-divided feedback signal and said output current signal comprises controlling said generating of said frequency-divided reference signal, said frequency-divided feedback signal and said output current signal such that said first, second and third ratios are equal.

* * * * *

UNITED STATES PATENT AND TRADEMARK OFFICE
CERTIFICATE OF CORRECTION

PATENT NO.     : 6,624,705 B1
DATED          : September 23, 2003
INVENTOR(S)    : Huard et al.

It is certified that error appears in the above-identified patent and that said Letters Patent is hereby corrected as shown below:

<u>Column 1,</u>
Line 58, please delete "1.9" and replace with the following: -- 19 --

<u>Column 4,</u>
Line 35, please delete "-" after the "a" and insert a space afterward.

<u>Column 6,</u>
Line 44, please delete ":" and replace with the following: -- . --

Signed and Sealed this

Eighteenth Day of November, 2003

JAMES E. ROGAN
*Director of the United States Patent and Trademark Office*